(12) United States Patent
Kazama et al.

(10) Patent No.: US 10,032,955 B2
(45) Date of Patent: Jul. 24, 2018

(54) QUANTUM DOT HAVING CORE-SHELL STRUCTURE

(71) Applicant: STANLEY ELECTRIC CO., LTD., Meguro-ku, Tokyo (JP)

(72) Inventors: Takuya Kazama, Tokyo (JP); Wataru Tamura, Yokohama (JP); Yasuyuki Miyake, Tokyo (JP)

(73) Assignee: STANLEY ELECTRIC CO., LTD., Tokyo (JP)

(*) Notice: Subject to any disclaimer, the term of this patent is extended or adjusted under 35 U.S.C. 154(b) by 0 days.

(21) Appl. No.: 15/698,047

(22) Filed: Sep. 7, 2017

(65) Prior Publication Data
US 2017/0373223 A1 Dec. 28, 2017

Related U.S. Application Data

(62) Division of application No. 15/000,872, filed on Jan. 19, 2016, now Pat. No. 9,773,942.

(30) Foreign Application Priority Data

Jan. 19, 2015 (JP) .................................. 2015-008085

(51) Int. Cl.
*H01L 29/06* (2006.01)
*H01L 33/06* (2010.01)
(Continued)

(52) U.S. Cl.
CPC .............. *H01L 33/06* (2013.01); *B82Y 30/00* (2013.01); *C30B 7/14* (2013.01); *C30B 29/16* (2013.01);
(Continued)

(58) Field of Classification Search
CPC ......... B82Y 20/00; B82Y 30/00; B82Y 40/00; C30B 29/16; C30B 29/403; C30B 29/48;
(Continued)

(56) References Cited

U.S. PATENT DOCUMENTS

2005/0214536 A1 9/2005 Schrier et al.
2007/0059527 A1* 3/2007 Jun ........................ B82Y 30/00
428/402.2

(Continued)

FOREIGN PATENT DOCUMENTS

EP 1980652 A2 10/2008
EP 2544253 A1 1/2013
(Continued)

OTHER PUBLICATIONS

Extended European Search Report dated Jul. 5, 2016, issued in counterpart European Application No. 16151913.7.
(Continued)

*Primary Examiner* — Syed Gheyas
(74) *Attorney, Agent, or Firm* — Holtz, Holtz & Volek PC

(57) ABSTRACT

A quantum dot having core-shell structure, including a core formed of $ZnO_zS_{1-z}$ of wurtzite crystal structure of hexagonal crystal system; a first shell covering the core, and formed of $Al_xGa_yIn_{1-x-y}N$ of wurtzite crystal structure of hexagonal crystal system; and a second shell covering the first shell, and formed of $ZnO_vS_{1-v}$ of wurtzite crystal structure of hexagonal crystal system. At least one of v, x, y, and z is not zero and is not one; differences between the lattice constants along a-axis of the core, the first shell and the second shell are not greater than 1%; and the core, the first shell and the second shell form band offset structure of type II.

5 Claims, 8 Drawing Sheets

(51) Int. Cl.
*H01L 33/00* (2010.01)
*C30B 29/48* (2006.01)
*C30B 29/40* (2006.01)
*C30B 29/16* (2006.01)
*C30B 29/60* (2006.01)
*B82Y 30/00* (2011.01)
*H01L 21/00* (2006.01)
*C30B 29/68* (2006.01)
*C30B 7/14* (2006.01)
*B82Y 40/00* (2011.01)
*B82Y 20/00* (2011.01)

(52) U.S. Cl.
CPC ............ *C30B 29/403* (2013.01); *C30B 29/48* (2013.01); *C30B 29/60* (2013.01); *C30B 29/68* (2013.01); *H01L 21/00* (2013.01); *H01L 33/002* (2013.01); *H01L 33/005* (2013.01); *B82Y 20/00* (2013.01); *B82Y 40/00* (2013.01)

(58) Field of Classification Search
CPC ......... C30B 29/60; C30B 29/68; H01L 33/06; H01L 33/002; H01L 33/005; H01L 21/00
See application file for complete search history.

(56) References Cited

U.S. PATENT DOCUMENTS

| | | |
|---|---|---|
| 2009/0202816 A1* | 8/2009 | Schlenoff ............... B82Y 30/00 428/331 |
| 2010/0163798 A1 | 7/2010 | Ryowa et al. |
| 2010/0163800 A1* | 7/2010 | Peng ........................ B82Y 15/00 252/301.6 S |
| 2011/0315954 A1 | 12/2011 | Jang et al. |
| 2012/0292594 A1 | 11/2012 | Zhou et al. |
| 2014/0284549 A1* | 9/2014 | Liu .......................... C09D 11/52 257/13 |
| 2015/0021550 A1 | 1/2015 | Kurtin et al. |
| 2015/0083991 A1 | 3/2015 | Tang et al. |

FOREIGN PATENT DOCUMENTS

| | | |
|---|---|---|
| JP | 2010155872 A | 7/2010 |
| JP | 2011076827 A | 4/2011 |
| JP | 2012087220 A | 5/2012 |

OTHER PUBLICATIONS

Tischer, et al., "Optical Properties of ZnO/GaN/InGaN Core-Shell Nanorods", Japanese Journal of Applied Physics, vol. 52, No. 7R, Jul. 1, 2013, pp. 075201-1-075201-5.

* cited by examiner

ZnO₀.₅₀S₀.₅₀ 31
InN 32
ZnO₀.₅₀S₀.₅₀ 33

ZnO₀.₅₀S₀.₅₀ 45
ZnO₀.₅₀S₀.₅₀ 41
InN 42
ZnO₀.₅₀S₀.₅₀ 43
InN 44

Al$_{0.33}$In$_{0.67}$N 56
Ga$_{0.40}$In$_{0.60}$N 55
ZnO$_{0.72}$S$_{0.28}$ 51
Al$_{0.33}$In$_{0.67}$N 52
Ga$_{0.40}$In$_{0.60}$N 53
Al$_{0.33}$In$_{0.67}$N 54

QUANTUM DOT HAVING CORE-SHELL STRUCTURE

CROSS REFERENCE TO RELATED APPLICATION

This application is a Divisional application of U.S. Ser. No. 15/000,872, filed Jan. 19, 2016, which is based on, and claims the benefit of priority of Japanese Patent Application JP 2015-8085, filed on Jan. 19, 2015, the entire contents of both of which are incorporated herein by reference.

BACKGROUND OF THE INVENTION

A) Field of the Invention

This invention relates to a quantum dot having core-shell structure.

B) Related Art

One of the uses of quantum dot including a semiconductor material is fluorescence generator. This type of quantum dot can generate fluorescent light of a predetermined wavelength in response to irradiation of light or particle of high energy. Such a quantum dot having core-shell structure in which a core made of such material as CdSe, CdS, InP, or GaP is covered with a shell layer or shell layers made of such material as ZnS, ZnSe, or the like has been proposed (for example, Japanese Unexamined Patent Application Publication No. 2011-76827). Core-shell structure in which a core of a III-V semiconductor (InGaN) is covered with a shell or shells of II-VI semiconductor (ZnO, ZnS, ZnSe, ZnTe, or the like) has also been proposed (for example, Japanese Unexamined Patent Application Publication No. 2010-155872).

Now, such quantum dots as CdSe/ZnS, InP/ZnS, or the like, in which a shell having a large energy gap is laminated on a core having a small energy gap, are used as visible light range quantum dots. When core-shell structure is made of different compound materials, there occurs generally lattice mismatch (CdSe/ZnS: 11.1%, InP/ZnS: 7.8%). The lattice mismatch will cause crystal lattice strain and may become causes of degradation in light emission efficiency and reliability.

There is proposal in which degradation in light emission efficiency by lattice mismatch is discussed as a problem, and fluorescence nanoparticle (multilayered core-shell structure of III-V semiconductor mixed crystals) in which a core of III-V $In_{1-x}Ga_xA$ mixed crystal (A=N or P) is covered with a plurality of shell layers made of III-V $In_{1-xn}Ga_{xn}A$ mixed crystal, where composition is selected as x<xn<xn+1 (for example, Japanese Unexamined Patent Application Publication No. 2012-87220).

SUMMARY OF THE INVENTION

An object of the embodiment is to provide a quantum dot having core-shell structure, providing high efficiency and high reliability.

According to one aspect, a quantum dot having core-shell structure, includes: a core formed of $ZnO_zS_{1-z}$; and at least one shell covering the core, and formed of $Al_xGa_yIn_{1-x-y}N$; wherein at least one of x, y, and z is not zero and is not one. $ZnO_zS_{1-z}$ and $Al_xGa_yIn_{1-x-y}N$ can be lattice-matched by controlling the composition.

The object and advantages of the invention will be realized and attained by means of the elements and combinations particularly pointed out in the claims.

It is to be understood that both the foregoing general description and the following detailed description are exemplary and are not restrictive of the invention, as claimed.

DESCRIPTION OF THE PREFERRED EMBODIMENTS

Figure 1:
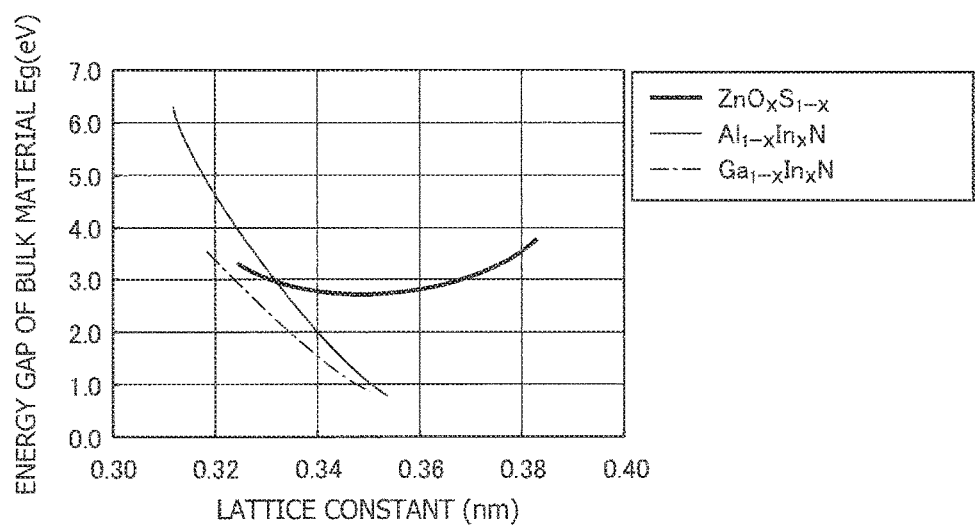
FIG. 1 is a graph illustrating relationships between lattice constants and energy gaps in ZnOS mixed crystal system, GaInN mixed crystal system, and AlInN mixed crystal system.

FIG. 1 is a graph illustrating relationship between lattice constant and energy gap, in ZnOS mixed crystal system, in GaInN mixed crystal system, and in AlInN mixed crystal system. The term "mixed crystal system" means a system including two substances at both ends and mixed crystal in intermediate region between the two substances. The horizontal axis represents lattice constant in unit of nanometer (nm), and the vertical axis represents energy gap in unit of electron volt (eV). The energy gap that determines the wavelength of light to be emitted is ZnO: 3.2 eV, ZnS: 3.8 eV, AlN: 6.2 eV, GaN: 3.4 eV, and InN: 0.64 eV.

In case when hexagonal crystal is grown along "c" axis direction, lattice constant in "a" axis direction is used as lattice constant in growth plane. Lattice constants in "a" axis direction of ZnO and ZnS are 0.324 nm and 0.382 nm, respectively, and the lattice constants in "a" axis direction of AlN, GaN, and InN are 0.311 nm, 0.320 nm, and 0.355 nm, respectively.

In case of paring compounds, combination of compounds having the closest lattice constants is ZnO having lattice constant of 0.324 nm and GaN having lattice constant of 0.320 nm, in which lattice mismatch in excess of 1% is present.

Figure 2:
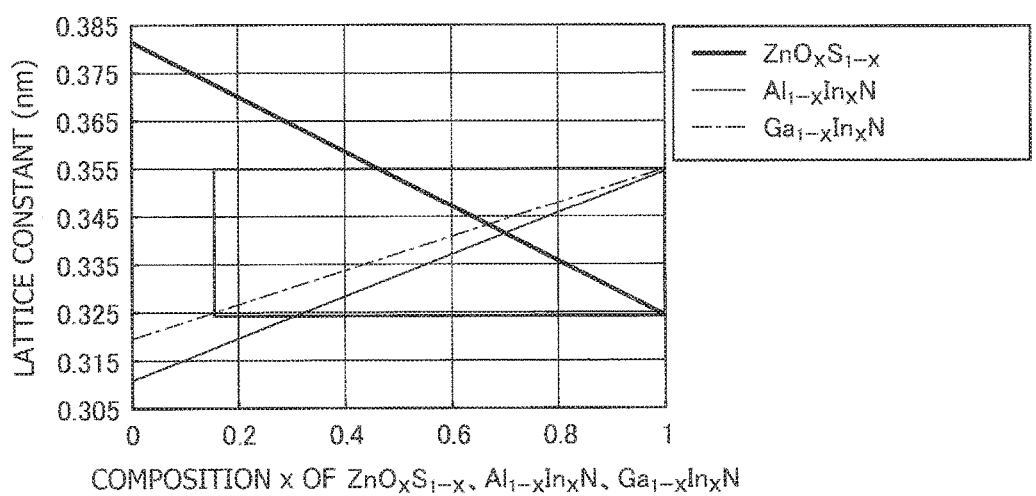
FIG. 2 is a graph illustrating change in the lattice constant with respect to composition x in ZnOS mixed crystal system, $Ga_{1-x}In_xN$ mixed crystal system, and $Al_{1-x}In_xN$ mixed crystal system.

FIG. 2 is a graph schematically illustrating change of the lattice constant (in "a" axis direction) with respect to composition x in $ZnO_xS_{1-x}$ mixed crystal system, in $Ga_{1-x}In_xN$ mixed crystal system, and in $Al_{1-x}In_xN$ mixed crystal system. Horizontal axis represents composition x, and vertical axis represents lattice constant. ZnOS and AlGaInN have the same wurtzite crystal structure of hexagonal crystal system. Employing mixed crystal, it is possible to adjust lattice constant in the intermediate composition region between the two end substances, realizing lattice matching.

Lattice constant, energy gap, and composition have constant relationships, and FIG. 2 illustrates basically the same contents as those of FIG. 1. Which of the graphs is to be used is determined depending on a parameter to be focused. For example, compositions that realize lattice matching are compositions that have the same value in vertical axis (lattice constant) in FIG. 2. A preferable range of lattice matching will be a range of a difference in lattice constants not greater than ±1.0%, taking the smaller lattice constant as reference (100%).

A range in which lattice matching can be realized between $ZnO_xS_{1-x}$ system, and $Al_{1-x}In_xN$ or $Ga_{1-x}In_xN$ system is shown to be enclosed in square. Lattice matching between ZnOS, and AlInN or GaInN is possible in composition ranges of $Al_{1-x}In_xN$ (x: 0.3 to 1.0), $Ga_{1-y}In_yN$ (y: 0.15 to 1.0), and $ZnOzS_{1-z}$ (z: 0.47 to 1.0).

In case of laminating lattice matching ZnOS and AlGaInN, it is possible to reduce strain at a lamination boundary. It will be possible to prevent crystal defects and to realize a quantum dot having high efficiency by reducing the strain.

A central portion of a quantum dot is referred to as "core", and circumferential or environmental layer surrounding the core is referred to as "shell". The core may also be referred to as "layer" depending on situation. It is possible to manufacture a quantum dot having high efficiency when crystal of the core is formed by using ZnOS, which can easily be manufactured, and crystal of lattice matching AlGaInN is heteroepitaxially grown thereon as shell. It is also possible to further laminate ZnOS or AlGaInN as shell crystal thereon.

There is a band offset structure of type I in which a layer having a narrow bandgap is sandwiched between layers having wider bandgap to enable carrier excitation/recombination in the layer having the narrow bandgap. In the band offset structure of type I, a layer that contributes to light emission may be referred to as "light emitting layer", and peripheral layers that do not contribute to light emission may be referred to as "barrier layer".

It is possible to form a light emitting layer that emits light and a barrier layer that transmits the emitted light by selecting bandgaps. It is also possible to increase light emission intensity, or emit lights of a plurality of wavelengths by forming a plurality of light emitting layers separated by barrier layers in a single quantum dot.

There is also a band offset structure of type II which allows carrier recombination between adjacent layers. A light emitting operation can be done at boundary between two layers.

First Embodiment

Figure 3A:
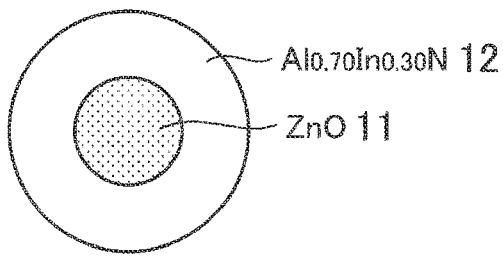
FIGS. 3A, 3B and 3C, respectively, are a sectional view schematically illustrating a configuration of a quantum dot having core-shell structure according to a first embodiment, a graph schematically illustrating band offset structure, and a side view schematically illustrating example of a reaction container.

FIG. 3A is a sectional view schematically illustrating a quantum dot having core-shell structure according to a first embodiment. A core 11 formed of ZnO is enclosed by a shell 12 formed of $Al_{0.70}In_{0.30}N$. As illustrated in FIGS. 1 and 2, the lattice constant of ZnO in "a" axis direction is 0.324 nm, and the lattice constant of $Al_{0.70}In_{0.30}N$ in "a" axis direction is also 0.324 nm, realizing lattice matching. For example, the radius r of the core 11 is 2.0 nm, and the thickness d of the shell 12 is 3.0 nm. Due to quantum effect, the bandgap energy of the ZnO core 11 is 3.6 eV, and the bandgap energy of the $Al_{0.70}In_{0.30}N$ shell 12 is 4.6 eV.

Figure 3B:
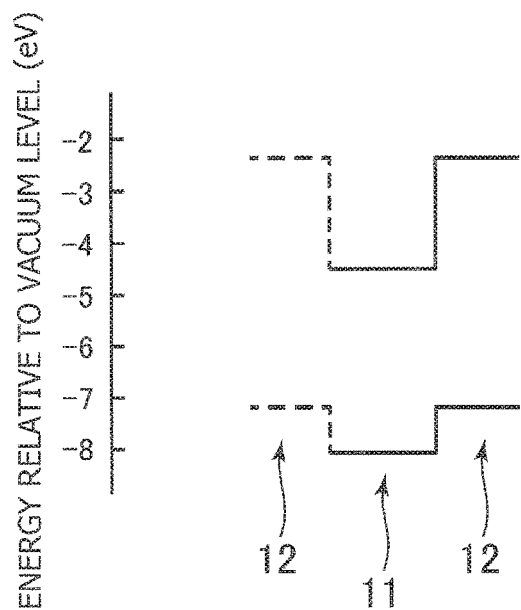

FIG. 3B illustrates band offset structure of type II formed by the ZnO core 11 and the $Al_{0.70}In_{0.30}N$ shell 12. It is expected that an energy gap of 2.75 eV (corresponding to blue region of wavelength 450 nm) is formed between conductive band of the ZnO core 11 and valence band of the $Al_{0.70}In_{0.30}N$ shell 12. It is expected that when energy particles, such as photons or electrons, having energy exceeding 2.75 eV are incident from outside, blue fluorescent light will be generated. Both ZnO and $Al_{0.70}In_{0.30}N$ are transparent with respect to light having a wavelength corresponding to 2.75 eV.

Although a single quantum dot is illustrated in FIG. 3A, multiple quantum dots are simultaneously formed in the following process of manufacturing quantum dots, and it is considered that variations in dimensions and wavelengths of fluorescent light will occur.

Hereinafter, description will be made on the process of manufacturing quantum dots according to the first embodiment.

Figure 3C:
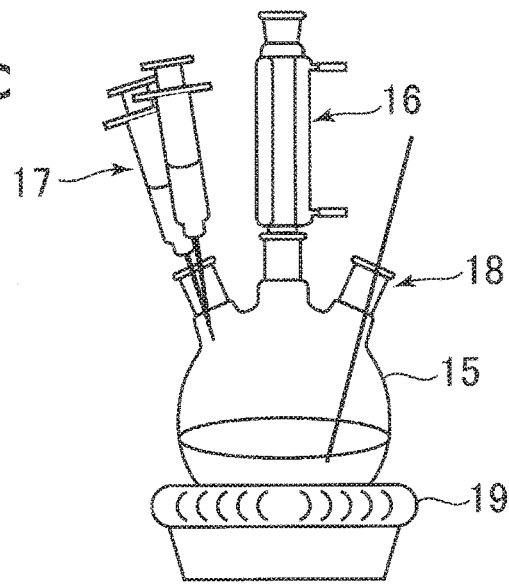

As illustrated in FIG. 3C, a 300 ml flask 15 made of quartz is prepared as a reaction container. The flask 15 is provided with an outlet, a port 16 substitutable with inert gas, a plurality of specific ports provided with syringes 17 through which reaction precursors can be supplied, and temperature measurement unit 18 attached with a thermocouple. As the inert gas, argon (Ar) is used. The flask 15 is placed on a mantle heater 19.

As reaction precursors, a syringe 17 containing diethyl zinc ($Zn(C_2H_5)_2$) sealed with inert gas and another syringe 17 containing octylamine ($C_8H_{17}NH_2$) which is bubbled with oxygen are respectively prepared. 410 μl of diethyl zinc and 660 μl of octylamine which is bubbled with oxygen are measured such that amounts of diethyl zinc ($Zn(C_2H_5)_2$) and octyl amine ($C_8H_{17}NH_2$) respectively become 4.0 mmol. Here, octylamine which is bubbled with oxygen is prepared by bubbling oxygen in octylamine ($C_8H_{17}NH_2$) for 2 minutes in advance.

8 g of tri-n-octylphosphine oxide (TOPO) and 4 g of hexadecylamine (HDA) as reaction solvents are put in the reaction container 15. The mixture is heated to 300° C. by using the mantle heater 19 while being stirred by a stirrer in an inert gas (Ar) atmosphere to melt all substances.

If the reaction solvent reaches 300° C., the reaction precursors are quickly put in from the respective syringes 17. Crystal core of ZnO is generated by thermal decomposition of the reaction precursors. The reaction container 15 is displaced from the heater immediately after input of the reaction precursors, and the temperature is naturally lowered down to 200° C. in 1 to 2 minutes. If the temperature is maintained at 300° C., major part of the reaction precursors will be spent for core formation and cores having various sizes will be generated with elapse of time. Cooling down can prevent formation of new cores in the reaction solvent.

Thereafter, the reaction solvent is re-heated to 240° C., and the temperature is kept constant for 20 minutes to grow ZnO cores 11.

Thereafter, the reaction container is naturally cooled down to 100° C. and is then subjected to heat treatment at 100° C. for 1 hour. In doing so, it is possible to stabilize the surfaces of the nanoparticles. Thereafter, the reaction container is cooled down to room temperature, and butanol as coaguration preventing agent is added to the reaction solution, and the reaction solution is then stirred for 10 hours for the purpose of preventing agglomeration or cohesion of nanoparticles. Purification is performed by repeating centrifugation (4000 rpm, 10 minutes) that alternately uses dehydrated methanol which dissolves solvent (TOPO) and toluene which disperses nanoparticles. By repetition, unnecessary raw materials and solvents are completely removed.

Next, $Al_{0.70}In_{0.30}N$ shell 12 is precipitated on the ZnO core 11. All the operations and synthesis are performed in a glove box by using vacuum-dried (140° C.) glass product and device.

Into a flask in which diphenyl ether (20 ml) as solvent is put, 6 ml of organic solvent in which produced ZnO nanoparticles are dispersed, aluminum iodide (171 mg, 0.41 mmol) as supply source of aluminum, indium iodide (83 mg, 0.18 mmol) as supply source of indium, sodium amide (500 mg, 12.8 mmol) as supply source of nitrogen, hexadecanethiol (380 µl, 1.0 mmol) as capping agent, and zinc stearate (379 mg, 0.6 mol) are put. Mixture solution is heated to 225° C. and is maintained at 225° C. for 60 minutes. $Al_{0.70}In_{0.30}N$ shell 12 grows on the ZnO core 11.

Thereafter, the reaction container is naturally cooled down to 100° C. and is then subjected to heat treatment at 100° C. for 1 hour. In doing so, it is possible to stabilize the surfaces of the nanoparticles. Thereafter, the reaction container is cooled down to room temperature, and butanol as coaguration preventing agent is added to the reaction solution, and the reaction solution is then stirred for 10 hours for the purpose of preventing agglomeration or cohesion of nanoparticles. Purification is performed by repeating centrifugation (4000 rpm, 10 minutes) that alternately uses dehydrated methanol which dissolves solvent (TOPO) and toluene which disperses nanoparticles. By repetition, unnecessary raw materials and solvents are completely removed. It is possible to obtain nanoparticles, in each of which $Al_{0.70}In_{0.30}N$ shell 12 grows on the ZnO core 11, through the aforementioned process.

Second Embodiment

Figure 4A:
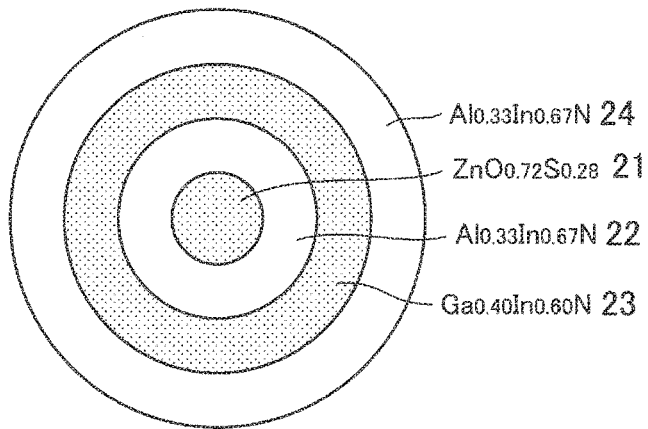
FIGS. 4A, 4B and 4C, respectively, are a sectional view schematically illustrating a configuration of a quantum dot having core-shell structure according to a second embodiment, a graph schematically illustrating band offset structure, and a side view schematically illustrating example of a reaction container.

FIG. 4A is a sectional view schematically illustrating a quantum dot having core-shell structure according to a second embodiment in which a first $Al_{0.33}In_{0.67}N$ shell layer 22, a second $Ga_{0.40}In_{0.60}N$ shell layer 23, and a third $Al_{0.33}In_{0.67}N$ shell layer 24 are laminated on a core 21 formed of $ZnO_{0.72}S_{0.28}$.

As can be understood from FIG. 1, bandgaps of bulk materials satisfy relation of $Ga_{0.40}In_{0.60}N<ZnO_{0.72}S_{0.28}<Al_{0.33}In_{0.67}N$. On the assumption that $Ga_{0.40}In_{0.60}N$ forms light emitting layer, $ZnO_{0.72}S_{0.28}$ and $Al_{0.33}In_{0.67}N$ become transparent layers for emitted light. As illustrated in FIG. 2, $ZnO_{0.72}S_{0.28}$, $Al_{0.33}In_{0.67}N$, and $Ga_{0.40}In_{0.60}N$ are lattice matched with lattice constant of 3.40 A.

For example, it is assumed that the radius r of the $ZnO_{0.72}S_{0.28}$ core 21 is 1.5 nm, the thickness d1 of the first $Al_{0.33}In_{0.67}N$ shell layer 22 is 2.0 nm, the thickness d2 of the second $Ga_{0.40}In_{0.60}N$ shell layer 23 is 1.9 nm, and the thickness d3 of the third $Al_{0.33}In_{0.67}N$ shell layer 24 is 2.2 nm.

Figure 4B:
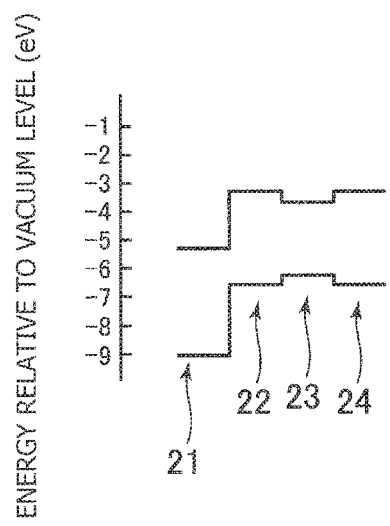

As illustrated in FIG. 4B, a quantum dot having band offset structure of type I having energy gap of 2.25 eV (green region, wavelength: 550 nm) is formed by the second $Ga_{0.40}In_{0.60}N$ shell layer 23, the first $Al_{0.33}In_{0.67}N$ shell layer 22 and the third $Al_{0.33}In_{0.67}N$ shell layer 24 on both sides thereof. The core, the first shell layers, and the third shell layers are transparent at the wavelength of the light to be emitted from the second shell layer serving as light emitting layer.

When the first $Al_{0.33}In_{0.67}N$ shell layer 22 is formed on the $ZnO_{0.72}S_{0.28}$ core 21 to form a quantum dot, band offset structure of type II is obtained. As compared with the first embodiment, the core is ZnOS mixed crystal, and the shell has a different composition. As described above, it is also possible to form modification of the first embodiment by making core with ZnOS mixed crystal and forming AlInN shell with a composition satisfying lattice matching.

Hereinafter, description will be made on manufacturing process. First, $ZnO_{0.72}S_{0.28}$ core is manufactured.

Figure 4C:
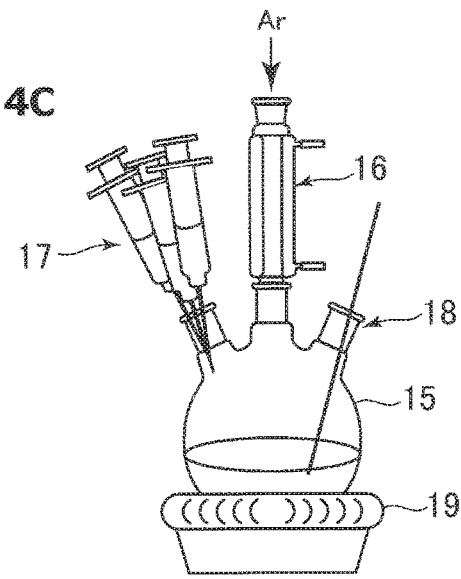

As illustrated in FIG. 4C, 300 ml flask 15 made of quartz is prepared as a reaction container. The flask 15 is provided with an outlet, a port 16 substitutable with inert gas, a plurality of specific ports provided with syringes 17 through which reaction precursors can be put in, and temperature measurement unit 18 attached with a thermocouple. As the inert gas, argon (Ar) is used. The flask 15 is placed on a mantle heater 19.

As reaction precursors, a syringe 17 containing diethyl zinc $(Zn(C_2H_5)_2)$ and sealed with inert gas, another syringe 17 containing octylamine $(C_8H_{17}NH_2)$ which is bubbled with oxygen, and another syringe containing bis(trimethylsilyl) sulfide are respectively prepared. 410 µl of diethyl zinc, 460 µl of octylamine, and 250 µl of bis(trimethylsilyl) sulfide are measured such that amount of diethyl zinc $(Zn(C_2H_5)_2)$ is 4.0 mmol, amount of octyl amine $(C_8H_{17}NH_2)$ which is bubbled with oxygen gas, is 2.8 mmol, and amount of bis(trimethylsilyl)sulfide is 1.2 mmol. Here, octylamine which is bubbled with oxygen is prepared by bubbling oxygen in octylamine $(C_8H_{17}NH_2)$ for 2 minutes in advance. It is possible to change the composition of the nanoparticles by changing the ratio of the reaction precursors.

8 g of tri-n-octylphosphine oxide (TOPO) and 4 g of hexadecylamine (HDA) as reaction solvents are put in the reaction container 15. The mixture is heated to 300° C. by using the mantle heater 19 while being stirred by a stirrer in an inert gas (Ar) atmosphere to melt all substances.

When the reaction solvent reaches 300° C., the reaction precursors are quickly put in from the respective syringes 17. Crystal core of $ZnO_{0.72}S_{0.28}$ is generated by thermal decomposition of the reaction precursors. The temperature is quickly lowered down to 200° C. immediately after the input of the reaction precursors. If the temperature is maintained at 300° C., major part of the reaction precursors will be spent for core formation and cores having various sizes will be generated with elapse of time. Quick cooling down can prevent formation of new cores in the reaction solvent. Thereafter, the reaction solvent is re-heated to 240° C., and the temperature is kept constant for 15 minutes to grow $ZnO_{0.72}S_{0.28}$ core.

Thereafter, the reaction container is naturally cooled down to 100° C. and is then subjected to heat treatment at 100° C. for 1 hour. In doing so, it is possible to stabilize the surfaces of the nanoparticles. Thereafter, the reaction container is cooled down to room temperature, and butanol as coaguration preventing agent is added to the reaction solution, and the reaction solution is then stirred for 10 hours for the purpose of preventing agglomeration or cohesion of nanoparticles. Purification is performed by repeating centrifugation (4000 rpm, 10 minutes) that alternately uses dehydrated methanol which dissolves solvent (TOPO) and toluene which disperses nanoparticles. By repetition, unnecessary raw materials and solvents are completely removed.

Then, first $Al_{0.33}In_{0.67}N$ shell layer 22 is formed on $ZnO_{0.72}S_{0.28}$ core 21. All the operations and synthesis are performed in a glove box by using vacuum-dried (140° C.) glass product and device. Into a flask in which diphenyl ether (20 ml) as solvent is put, 6 ml of the organic solvent in which $ZnO_{0.72}S_{0.28}$ nanoparticles produced in the previous process are dispersed, aluminum iodide (80 mg, 0.20 mmol) as supply source of aluminum, indium iodide (185 mg, 0.40 mmol) as supply source of indium, sodium amide (500 mg, 12.8 mmol) as supply source of nitrogen, hexadecanethiol (380 μl, 1.0 mmol) as capping agent, and zinc stearate (379 mg, 0.6 mol) are put in. Mixture solution is quickly heated to 225° C. and is maintained at 225° C. for 40 minutes. First $Al_{0.33}In_{0.67}N$ shell layer 22 grows on the $ZnO_{0.72}S_{0.28}$ core 21.

Thereafter, the reaction container is naturally cooled down to 100° C. and is then maintained at 100° C. for 1 hour. In doing so, it is possible to stabilize the surfaces of the nanoparticles. Thereafter, the reaction container is cooled down to room temperature, and butanol as coaguration preventing agent is added to the reaction solution, and the reaction solution is then stirred for 10 hours, for the purpose of preventing agglomeration of the nanoparticles. Purification is performed by repeating centrifugation (4000 rpm, 10 minutes) that alternately uses dehydrated methanol which dissolves solvent (TOPO) and toluene which disperses nanoparticles. By repetition, unnecessary raw materials and solvents are completely removed. It is possible to obtain nanoparticles, in each of which $Ga_{0.40}In_{0.60}N$ second shell 23 is formed on nano particles which contain first $Al_{0.33}In_{0.67}N$ shell layer 22 on $ZnO_{0.72}S_{0.28}$ core 21, through the aforementioned process.

Then, second $Ga_{0.40}In_{0.60}N$ shell layer 24 is formed on first $Al_{0.33}In_{0.67}N$ shell layer 23. Into a flask in which diphenyl ether (20 ml) is placed, 6 ml of the organic solvent in which $ZnO_{0.72}S_{0.28}/Al_{0.33}In_{0.67}N$ nanoparticles produced in the previous process are dispersed, gallium iodide (108 mg, 0.24 mmol) as supply source of gallium, indium iodide (165 mg, 0.36 mmol) as supply source of indium, sodium amide (500 mg, 12.8 mmol) as supply source of nitrogen, hexadecanethiol (380 μl, 1.0 mmol) as a capping agent, and zinc stearate (379 mg, 0.6 mol) are put in. The mixture solution is quickly heated to 225° C. and is maintained at 225° C. for 38 minutes. The second $Ga_{0.40}In_{0.60}N$ shell layer 23 grows on the first $Al_{0.33}In_{0.67}N$ shell layer 22.

Thereafter, the reaction container is naturally cooled down to 100° C. and is then maintained at 100° C. for 1 hour. In doing so, it is possible to stabilize the surfaces of the nanoparticles. Thereafter, the reaction container is cooled down to room temperature, and butanol as coaguration preventing agent is added to reaction solution, and the reaction solution is then stirred for 10 hours, for the purpose of preventing agglomeration of nanoparticles. Purification is performed by repeating centrifugation (4000 rpm, 10 minutes) that alternately uses dehydrated methanol which dissolves solvent (TOPO) and toluene which disperses nanoparticles. By repetition, unnecessary raw materials and solvents are completely removed. It is possible to obtain nanoparticles, each of which is formed of $ZnO_{0.72}S_{0.28}$ core 21/$Al_{0.33}In_{0.67}N$ first shell layer 22, on each of which second $Ga_{0.40}In_{0.60}N$ shell layer 23 grows through the aforementioned process. Next, third $Al_{0.33}In_{0.67}N$ shell layer is formed on second $Ga_{0.40}In_{0.60}N$ shell layer 23. Into a flask containing diphenyl ether (20 ml) as solvent, 6 ml of the organic solvent in which $ZnO_{0.72}S_{0.28}/Al_{0.33}In_{0.67}N/Ga_{0.40}In_{0.60}N$ nanoparticles produced in the previous process are dispersed, aluminum iodide (80 mg, 0.20 mmol) as supply source of aluminum, indium iodide (185 mg, 0.40 mmol) as supply source of indium, sodium amide (500 mg, 12.8 mmol) as supply source of nitrogen, hexadecanethiol (380 μl, 1.0 mmol) as capping agent, and zinc stearate (379 mg, 0.6 mol) are put. Mixture solution is quickly heated to 225° C. and is maintained at 225° C. for 44 minutes. Third $Al_{0.33}In_{0.67}N$ shell layer 24 grows on the second $Ga_{0.40}In_{0.60}N$ shell layer 23.

Thereafter, the reaction container is naturally cooled down to 100° C. and is then maintained at 100° C. for 1 hour. In doing so, it is possible to stabilize the surfaces of the nanoparticles. Thereafter, the reaction container is cooled down to room temperature, and butanol as coaguration preventing agent is added to the reaction solution, and the reaction solution is then stirred for 10 hours, for the purpose of preventing agglomeration of nanoparticles. Purification is performed by repeating centrifugation (4000 rpm, 10 minutes) that alternately uses dehydrated methanol which dissolves solvent (TOPO) and toluene which disperses nanoparticles. By repetition, unnecessary raw materials and solvents are completely removed. It is possible to obtain nanoparticles, on each of which $ZnO_{0.72}S_{0.28}$ core 21/first $Al_{0.33}In_{0.67}N$ shell layer 22/second $Ga_{0.40}In_{0.60}N$ shell layer 23 are laminated and third $Al_{0.33}In_{0.67}N$ shell layer 24 is formed thereon, through the aforementioned process.

Third Embodiment

Figure 5A:
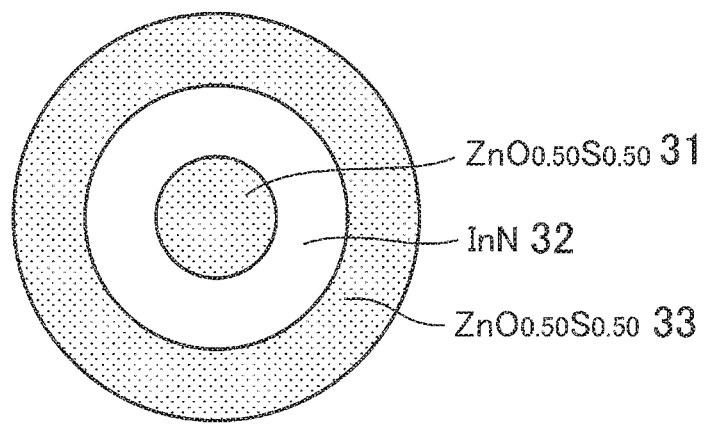
FIGS. 5A and 5B, respectively, are a sectional view schematically illustrating a quantum dot having core-shell structure according to a third embodiment, and a graph schematically illustrating band offset structure.

FIG. 5A is a sectional view illustrating a quantum dot having core-shell structure according to third embodiment in which first InN shell layer 32 and second $ZnO_{0.50}S_{0.50}$ shell layer 33 are laminated on $ZnO_{0.50}S_{0.50}$ core 31. $ZnO_{0.50}S_{0.50}$ and InN are lattice matched at lattice constant 0.355 nm. For example, it is assumed that the radius r of $ZnO_{0.50}S_{0.50}$ core 31 is 1.4 nm, the thickness d1 of first InN shell layer 32 is 2.0 nm, and the thickness d2 of second $ZnO_{0.50}S_{0.50}$ shell layer 33 is 1.6 nm.

Figure 5B:
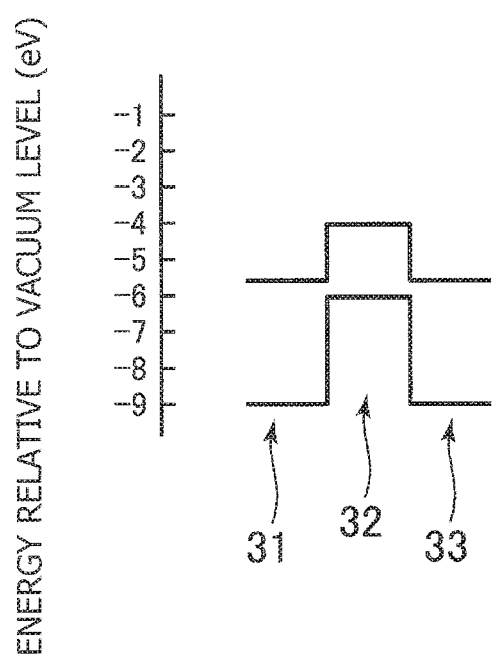

FIG. 5B illustrates band offset structure of type II incorporating quantum effect, that is formed by $ZnO_{0.50}S_{0.50}$ core 31, first InN shell layer 32, and second $ZnO_{0.50}S_{0.50}$ shell layer 33. Quantum dot having two band offsets, having energy gap of 0.4 eV (infrared range, wavelength: 3000 nm) between valence band of first InN shell layer 32 and conduction band of core 31 and second shell layer 33 on both sides is expected.

It is also possible to form first shell layer of $Al_xGa_yIn_{1-x-y}N$ mixed crystal in place of compound InN to obtain quantum dot having $ZnO_zS_{1-z}$ core and second shell, that are lattice matched with first shell layer.

When first InN shell layer 32 is formed on $ZnO_{0.50}S_{0.50}$ core 31, a quantum dot having single band offset of type II will be obtained. This can be considered as modification of the first embodiment, in which core is formed of ZnOS mixed crystal and shell is formed of III-V compound.

The quantum dot according to the third embodiment can be manufactured, for example by the following manufacturing process. First, spherical $ZnO_{0.50}S_{0.50}$ core 31 is formed. In manufacturing process similar to the second embodiment, $ZnO_{0.50}S_{0.50}$ can be synthesized by adjusting amounts of the reaction precursors. For example, 410 μl of diethyl zinc, 330 μl of octylamine, and 420 μl of bis (trimethylsilyl)sulfide are prepared as reaction precursors in syringes such that amount of diethyl zinc $(Zn(C_2H_5)_2)$ is 4.0 mmol, amount of octylamine $(C_8H_{17}NH_2)$ which is bubbled with oxygen gas is 2.0 mmol, and amount of bis(trimethylsilyl)sulfide is 2.0 mmol.

8 g of TOPO and 4 g of HDA as reaction solvents are put in reaction container, and inert atmosphere (Ar) is formed. The reaction container is heated to 300° C. and the reaction precursors are put in the reaction container from the syringes. $ZnO_{0.50}S_{0.50}$ nanoparticles are synthesized by thermal decomposition of reaction precursors. Immediately after input of the reaction precursors, temperature of the reaction container is quickly lowered down to 200° C. Thereafter, the reaction solvent is re-heated to 240° C. and is maintained at 240° C. for 14 minutes. $ZnO_{0.50}S_{0.50}$ core 31 grows. Then, the reaction container is naturally cooled down to 100° C. and is maintained at 100° C. for 1 hour. Thereafter, purification is performed by repeating similar centrifugation as described above. $ZnO_{0.50}S_{0.50}$ core 31 is manufactured.

Then, first InN shell layer 32 and second $ZnO_{0.50}S_{0.50}$ shell layer 33 are formed to cover $ZnO_{0.50}S_{0.50}$ core 31. Process of manufacturing first InN shell layer 32 may be basically performed similar to that of the first embodiment wherein amount of aluminum iodide as supply source of Al is set to zero. Second $ZnO_{0.50}S_{0.50}$ shell layer 33 can be formed by similar process as the process of manufacturing $ZnO_{0.50}S_{0.50}$ core.

Into a flask containing diphenyl ether (20 ml) as solvent, together with 6 ml of organic solvent dispersed with $ZnO_{0.50}S_{0.50}$ nanoparticles 31 produced in the aforementioned process, indium iodide (270 mg, 0.6 mmol) as supply source of indium, sodium amide (500 mg, 12.8 mmol) as supply source of nitrogen, hexadecanethiol (380 μl, 1.0 mmol) as capping agent, and zinc stearate (379 mg, 0.6 mol) are put. Mixture solution is quickly heated to 225° C. and is then maintained at 225° C. for 66 minutes. Then, first InN shell layer 32 grows.

Thereafter, the reaction container is naturally cooled down to 100° C. and is maintained at 100° C. for 1 hour. Then, purification is performed by repeating centrifugation that is similar to that described above. Nanoparticles in which first InN shell layer 32 is grown on $ZnO_{0.50}S_{0.50}$ core 31 are obtained through the aforementioned process.

Second $ZnO_{0.50}S_{0.50}$ shell layer 33 is formed on first InN shell layer 32. As reaction precursors, syringe containing diethyl zinc $(Zn(C_2H_5)_2$ and sealed with inert gas (Ar), syringe containing octylamine $(C_8H_{17}NH_2)$ which is bubble-coupled with oxygen, syringe containing bis (trimethylsilyl) sulfide, and syringe containing solution dispersed with $ZnO_{0.5}S_{0.5}$/InN nanoparticles, are prepared. 410 μl of diethyl zinc, 330 μl of octylamine, 420 μl of bis(trimethylsilyl)sulfide, and 2.0 ml of solution containing $ZnO_{0.5}S_{0.5}$/InN nanoparticles are measured such that amount of diethyl zinc $(Zn(C_2H_5)_2)$ is 4.0 mmol, amount of octylamine $(C_8H_{17}NH_2)$ is 2.0 mmol, and amount of bis(trimethylsilyl) sulfide is 2.0 mmol.

8 g of TOPO and 4 g of HDA as reaction solvents are put in a flask serving as a reaction container, and the reaction solvent is heated to 300° C. in an inert gas (Ar) atmosphere to dissolve the content. When the reaction solvent reaches 300° C., the reaction precursors are dropped from the respective syringes. As for the dropping speed, the reaction precursors are dropped at a speed of one drop per 30 seconds. Second $ZnO_{0.50}S_{0.50}$ shell layer 33 grows. After all the reaction precursors are dropped, the reaction container is cooled down to 100° C., and the temperature is maintained for 1 hour for annealing. In doing so, it is possible to stabilize the surfaces of the nanoparticles.

Thereafter, the temperature is lowered down to room temperature, and butanol as coaguration preventing agent is added. The reaction solution is then stirred for 10 hours for the purpose of preventing agglomeration of the nanoparticles. The surfaces of the nanoparticles are stabilized by heat treatment. Finally, purification is performed by repeating centrifugation (4000 rpm, 10 minutes) that alternately uses dehydrated methanol which dissolves solvent (TOPO) and toluene which disperses nanoparticles. By repetition, unnecessary raw materials and solvents are completely removed. In doing so, it is possible to synthesize nanoparticles containing $ZnO_{0.50}S_{0.50}$ core 31/first InN shell layer 32/second $ZnO_{0.50}S_{0.50}$ shell layer 33.

Fourth Embodiment

Figure 6A:
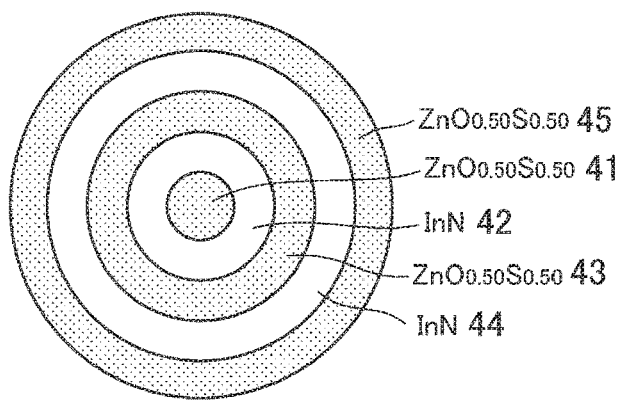
FIGS. 6A, 6B and 6C, respectively, are a sectional view schematically illustrating a configuration of a quantum dot having core-shell structure according to a fourth embodiment, a graph schematically illustrating band offset structure, and a side view schematically illustrating example of a reaction container provided with excitation light source and detector.

FIG. 6A is a sectional view schematically illustrating a quantum dot according to fourth embodiment in which two shells are further formed on the quantum dot according to the third embodiment. $ZnO_{0.50}S_{0.50}$ core 41 is surrounded by first InN shell layer 42, second $ZnO_{0.50}S_{0.50}$ shell layer 43, third InN shell layer 44, and fourth $ZnO_{0.50}S_{0.50}$ shell layer 45 to form a quantum dot. It may be said that the configuration is obtained by further laminating third InN shell layer and fourth $ZnO_{0.50}S_{0.50}$ shell layer on second $ZnO_{0.50}S_{0.50}$ shell layer according to the third embodiment, to form multi-stacked light emitting mechanism. It is possible to enhance intensity of emitted light by multi-stacked light emitting mechanism. Core 41 and first, second, third, and fourth shell layers 42 to 45 are lattice matched at a lattice constant of 0.355 nm.

For example, it is assumed that radius r of the $ZnO_{0.50}S_{0.50}$ core 41 is 1.4 nm, thickness d1 of the first InN shell layer 42 is 2.0 nm, thickness d2 of the second $ZnO_{0.50}S_{0.50}$ shell layer 43 is 1.4 nm, thickness d3 of the third InN shell layer 44 is 2.0 nm, and thickness d4 of the fourth $ZnO_{0.50}S_{0.50}$ shell layer 45 is 1.6 nm.

Figure 6B:
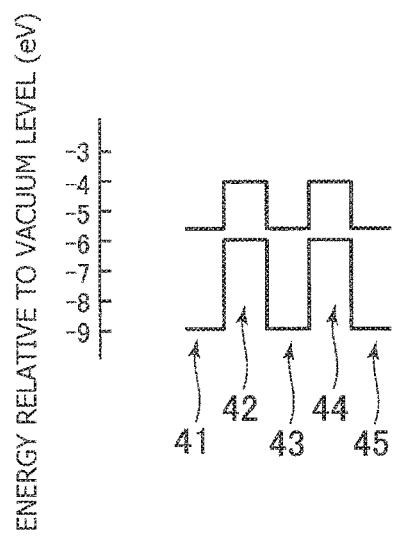

FIG. 6B illustrates band offset structure of type II, incorporating quantum effect, that is formed by $ZnO_{0.50}S_{0.50}$ core 41, first InN shell layer 42, second $ZnO_{0.50}S_{0.50}$ shell layer 43, third InN shell layer 44, and fourth $ZnO_{0.50}S_{0.50}$ shell layer 45. It is expected that band offsets of type II having energy gap of 0.4 eV (infrared region, wavelength: 3000 nm) are formed between valence band of first InN shell layer 42 and, on both sides, conduction bands of core 41 and second shell layer 43, and between valence band of third InN shell layer 44 and, on both sides, conduction bands of second shell layer 43 and fourth shell layer 45. It is possible to enhance intensity of emitted light from each quantum dot by providing a plurality of band offset structures.

The quantum dot according to the fourth embodiment can be manufactured, for example by forming a quantum dot including $ZnO_{0.50}S_{0.50}$ core 41, first InN shell layer 42, and second $ZnO_{0.50}S_{0.50}$ shell layer 43 by similar manufacturing process as that in the third embodiment, and further forming third InN shell layer 44 and fourth $ZnO_{0.50}S_{0.50}$ shell layer 45 by similar manufacturing process as that for first shell layer and second shell layer.

For enhancing size controllability, it is possible to control size of the fourth $ZnO_{0.50}S_{0.50}$ shell layer 45 by monitoring wavelength of light emitted from nanoparticles in the reaction container by irradiating reaction container synthesizing fourth $ZnO_{0.50}S_{0.50}$ shell layer 45, with light of 405 nm (or any light having a larger energy than the bandgap energy of the nanoparticles). The quantum effect of the nanoparticle as a whole changes as fourth $ZnO_{0.50}S_{0.50}$ shell layer 45 is deposited on third InN shell layer 44 (changing thickness thereof).

Figure 6C:
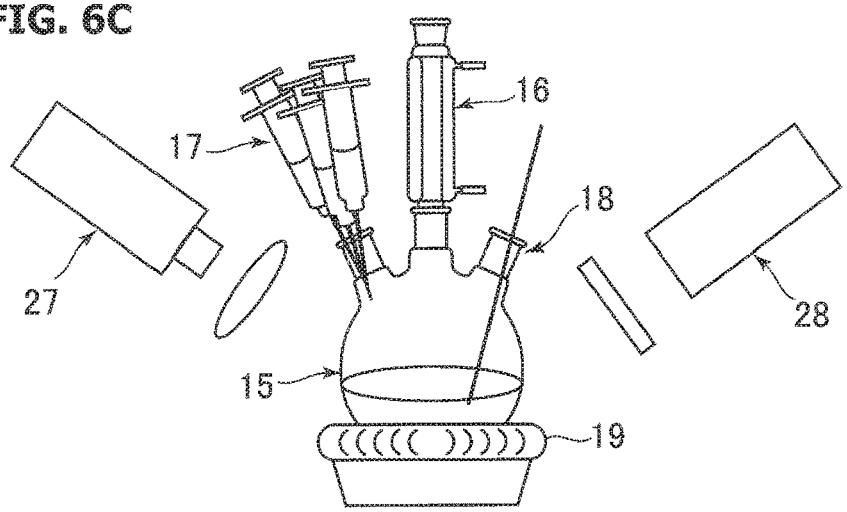

As illustrated in FIG. 6C, reaction solution in the reaction container 15 is irradiated with excitation light having a predetermined wavelength from an excitation light source 27, and fluorescent light generated from quantum dots in the reaction solution is detected by detector 28 that has spectroscopic function. Growth of nanoparticles is stopped when single wavelength of emitted lights is obtained. Growth of nanoparticles is stopped by cooling the reaction container at this time.

Fifth Embodiment

Figure 7A:
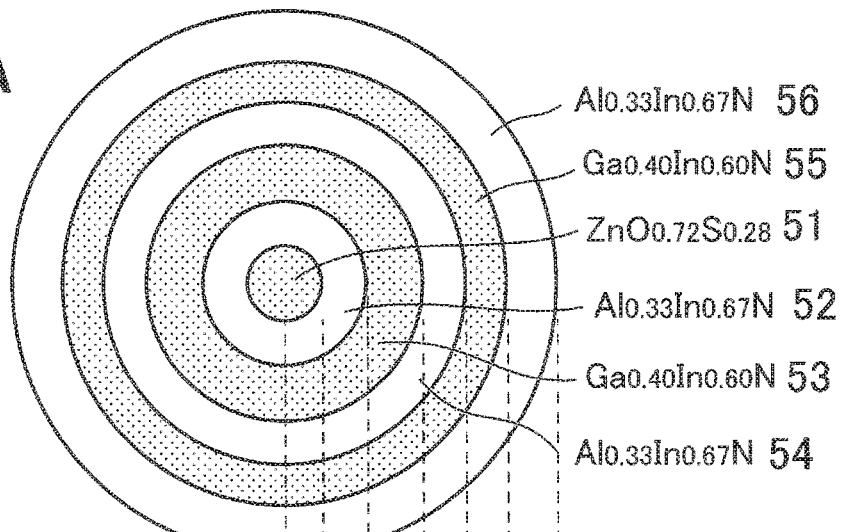
FIGS. 7A and 7B, respectively, are a sectional view schematically illustrating a configuration of a quantum dot having core-shell structure according to a fifth embodiment and a graph schematically illustrating band offset structure.

FIG. 7A is a sectional view schematically illustrating a quantum dot according to fifth embodiment in which two shells are further formed on the quantum dot according to the second embodiment. The quantum dot has core-shell structure in which first $Al_{0.33}In_{0.67}N$ shell layer 52, second $Ga_{0.40}In_{0.60}N$ shell layer 53, third $Al_{0.33}In_{0.67}N$ shell layer 54, fourth $Ga_{0.40}In_{0.60}N$ shell layer 55, and fifth $Al_{0.33}In_{0.67}N$ shell layer 56 are laminated on core 51 that is formed of $ZnO_{0.72}S_{0.28}$.

As can be understood from FIG. 1, the bandgaps in bulk state satisfy relation of $Ga_{0.40}In_{0.60}N<ZnO_{0.72}S_{0.28}<Al_{0.33}In_{0.67}N$. When $Ga_{0.40}In_{0.60}N$ serves as light emitter, $ZnO_{0.72}S_{0.28}$ and $Al_{0.33}In_{0.67}N$ are transparent to light emitted from the quantum dot. As illustrated in FIG. 2, $ZnO_{0.72}S_{0.28}$, $Al_{0.33}In_{0.67}N$, and $Ga_{0.40}In_{0.60}N$ are lattice matched at a lattice constant of 3.40 A.

For example, let us assume that radius r of $ZnO_{0.72}S_{0.28}$ core 51 is 1.5 nm, thickness d1 of first $Al_{0.33}In_{0.67}N$ shell layer 52 is 2.0 nm, thickness d2 of second $Ga_{0.40}In_{0.60}N$ shell layer 53 is 2.4 nm, thickness d3 of third $Al_{0.33}In_{0.67}N$ shell layer 54 is 2.0 nm, thickness d4 of fourth $Ga_{0.40}In_{0.60}N$ shell layer 55 is 1.9 nm, and thickness d5 of fifth $Al_{0.33}In_{0.67}N$ shell layer 56 is 2.2 nm.

Figure 7B:
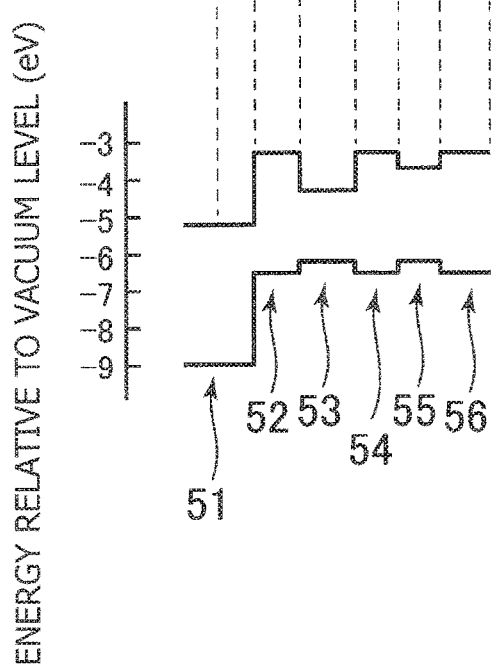

FIG. 7B is a band diagram schematically illustrating band offset structure formed of constituent elements of the quantum dot incorporating quantum effect. Second and fourth $Ga_{0.40}In_{0.60}N$ shell layers 53 and 55 form band offset structure of type I having a narrower bandgap than those of first $Al_{0.33}In_{0.67}N$ shell layer 52, third $Al_{0.33}In_{0.67}N$ shell layer 54, and fifth $Al_{0.33}In_{0.67}N$ shell layer 56.

When second and fourth $Ga_{0.40}In_{0.60}N$ shell layers 53 and 55 function as light emitting layers, first $Al_{0.33}In_{0.67}N$ shell layer 52, third $Al_{0.33}In_{0.67}N$ shell layer 54, and fifth $Al_{0.33}In_{0.67}N$ shell layer 56 function as barrier layers. For example, second $Ga_{0.40}In_{0.60}N$ shell layer 53 having a thickness of 2.4 nm generates red light having a wavelength of 625 nm, and fourth $Ga_{0.40}In_{0.60}N$ shell layer 55 having a thickness of 1.9 nm generates green light having a wavelength of 550 nm.

It may be said that this quantum dot is formed by multi-stacking the laminated structure according to the second embodiment. When fluorescent lights having different wavelengths are generated, it is possible to obtain white light by irradiating blue light, and generating green light and red light, by fluorescence. Alternately, fluorescent lights having the same color may be generated. In this case, it is possible to enhance intensity of the emitted lights.

The quantum dot according to the fifth embodiment can be manufactured basically by further forming fourth $Ga_{0.40}In_{0.60}N$ shell layer and fifth $Al_{0.33}In_{0.67}N$ shell layer having adjusted thicknesses on the quantum dot according to the second embodiment.

For enhancing size controllability, it is possible to control size of $Ga_{0.40}In_{0.60}N$ by monitoring wavelength of light (fluorescent light) emitted from nanoparticles in the reaction container with detector 29, by irradiating reaction solution synthesizing nanoparticles, with excitation light of 405 nm (or any excitation light having a larger energy than the bandgap energy of the nanoparticles) from an excitation light source 28, as illustrated in FIG. 6C. The quantum effect in the nanoparticle changes as a whole, as fourth $Ga_{0.40}In_{0.60}N$ shell layer 55 is being deposited to increase the thickness, on the third $Al_{0.33}In_{0.67}N$ shell layer 54. The reaction container is cooled down to stop the growth when measured spectrum indicates two targeted wavelengths (550 nm and 625 nm).

It is also possible to emit fluorescent lights of the same wavelength from the two light emitting layers. In this case, a quantum dot having enhanced intensity of emitted light is obtained. Description has been made on configurations in which one to five shells are formed around the core. These are only non-limiting examples, and the total number of shells is not limited thereto.

Figure 8:
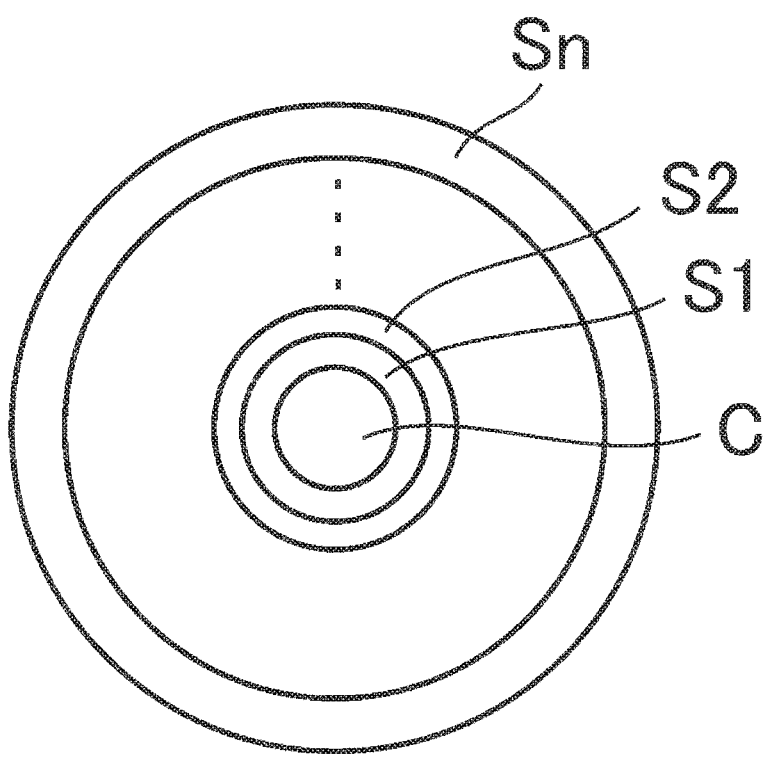
FIG. 8 is a sectional view schematically illustrating a quantum dot having multilayered shell structure.

As illustrated in FIG. 8, it is possible to obtain a quantum dot in which n shells are formed around a core C. It is also possible to form band offset structures in which the plurality of shells form type I band offset and type II band offset. In order to obtain the quantum effect, diameter of the quantum dot is preferably equal to or less than 20 nm. It is also possible to form a protective layer surrounding a quantum dot having a diameter equal to or less than 20 nm.

Although quantum dot particle had spherical shape in the foregoing embodiments, the shape of quantum dot particle is not particularly limited. Methods of synthesizing the quantum dot are described only for illustrative purposes. Quantum dot nanoparticles may be synthesized from solution by other methods such as solvothermal method using high-temperature reaction in alcohol solvent.

All examples and conditional language recited herein are intended for pedagogical purposes to aid the reader in understanding the invention and the concepts contributed by the inventors to furthering the art, and are to be construed as being without limitation to such specifically recited examples and conditions, nor does the organization of such examples in the specification relate to a showing of the superiority and inferiority of the invention. It should be understood that various changes, substitutions, and alterations could be made hereto without departing from the spirit and scope of the invention.

What is claimed is:

1. A quantum dot having a core-shell structure, comprising:
   a core formed of $ZnO_zS_{1-z}$ of wurtzite crystal structure of hexagonal crystal system;
   a first shell covering the core, and formed of $Al_xGa_yIn_{1-x-y}N$ of wurtzite crystal structure of hexagonal crystal system; and
   a second shell covering the first shell, and formed of $ZnO_vS_{1-v}$ of wurtzite crystal structure of hexagonal crystal system;
   wherein at least one of v, x, y, and z is not zero and is not one;

wherein differences between lattice constants along a-axis of the core, the first shell and the second shell are not greater than 1%; and wherein the core, the first shell and the second shell form a band offset structure of type II, wherein an energy level of a valence band of the first shell is higher than energy levels of valence bands of the core and the second shell, and energy levels of conduction bands of the core and the second shell are lower than an energy level of a conduction band of the first shell.

2. The quantum dot having a core-shell structure according to claim 1, wherein the quantum dot has two band offsets having an energy gap of an infrared range between the valence band of the first shell and the conduction bands of the core and the second shell.

3. The quantum dot having a core-shell structure according to claim 1, wherein the first shell is formed of InN, and the core and the second shell are formed of $ZnO_{0.5}S_{0.5}$.

4. The quantum dot having a core-shell structure according to claim 1, further comprising:
a third shell covering the second shell, and formed of $Al_rGa_sIn_{1-r-s}N$ of wurtzite crystal structure of hexagonal crystal system; and
a fourth shell covering the third shell, and formed of $ZnO_tS_{1-t}$ of wurtzite crystal structure of hexagonal crystal system,
wherein the second, the third, and the fourth shells form a band offset structure of type II, wherein an energy level of a valence band of the third shell is higher than energy levels of valence bands of the second and the fourth shells, and energy levels of conduction bands of the second and the fourth shells are lower than an energy level of a conduction band of the third shell.

5. The quantum dot having a core-shell structure according to claim 4, wherein the third shell is formed of InN, and the fourth shell is formed of $ZnO_uS_{1-u}$.

* * * * *